(12) United States Patent
Baek et al.

(10) Patent No.: US 8,546,887 B2
(45) Date of Patent: Oct. 1, 2013

(54) SEMICONDUCTOR DEVICES

(75) Inventors: Sang Hum Baek, Yongin-si (KR); Sunghoo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/459,423

(22) Filed: Apr. 30, 2012

(65) Prior Publication Data

US 2012/0292712 A1    Nov. 22, 2012

(30) Foreign Application Priority Data

May 20, 2011    (KR) .......................... 10-2011-0048091

(51) Int. Cl.
*H01L 27/092*    (2006.01)

(52) U.S. Cl.
USPC ............. 257/369; 257/E23.015; 257/E27.06; 257/E27.062; 257/E29.012

(58) Field of Classification Search
USPC ................... 257/E23.015, E27.06, E27.062, 257/E29.012, E29.013, 369, 368
See application file for complete search history.

(56) References Cited

U.S. PATENT DOCUMENTS

| 6,815,776 | B2 | 11/2004 | Lee et al. |
| 6,936,893 | B2 | 8/2005 | Tanaka et al. |
| 7,176,539 | B2 | 2/2007 | Chen |
| 2008/0265335 | A1* | 10/2008 | Ryu et al. ...................... 257/390 |

FOREIGN PATENT DOCUMENTS

| JP | 08-181127 | | 7/1996 |
| JP | 2002-217305 | A | 8/2002 |
| JP | 2002-289786 | A | 10/2002 |
| JP | 2004-349634 | A | 12/2004 |
| JP | 2009-071173 | A | 4/2009 |
| JP | 2010-199301 | A | 9/2010 |
| KR | 10-0125307 | B1 | 10/1997 |
| KR | 10-0383003 | B1 | 4/2003 |
| KR | 1020060122132 | A | 11/2006 |
| KR | 1020090011562 | A | 2/2009 |
| KR | 1020090107818 | A | 10/2009 |

\* cited by examiner

*Primary Examiner* — Zandra V. Smith
*Assistant Examiner* — Paul Patton
(74) *Attorney, Agent, or Firm* — Volentine & Whitt, PLLC

(57) ABSTRACT

A semiconductor device including a driving region and a dummy region disposed at both side of the driving region includes a semiconductor substrate having a plurality of active regions spaced from each by equal distances in the driving region, a dummy active region in the dummy region, and a guard ring region surrounding the active regions and the dummy active regions. The distance between the dummy active region and the active region nearest to the dummy active region is substantially the same as each distance between adjacent ones of the active regions, and is smaller than the distance between the dummy active region and a portion of the guard ring region nearest to the dummy active region.

20 Claims, 4 Drawing Sheets

SEMICONDUCTOR DEVICES

PRIORITY STATEMENT

This U.S. non-provisional patent application claims priority under 35 U.S.C. §119 to Korean Patent Application No. 10-2011-0048091, filed on May 20, 2011, the entirety of which is incorporated by reference herein.

BACKGROUND

The inventive concept relates to semiconductor devices. More particularly, the inventive concept relates to semiconductor devices having a dummy active region.

There is a growing demand for semiconductor devices that operate at higher speeds and/or that have higher degrees of integration. Accordingly, a great amount of importance is attached to the layout design of semiconductor devices as well as the circuit design of and techniques used for manufacturing today's semiconductor devices.

A typical semiconductor device includes a semiconductor substrate, a device isolation pattern dividing the substrate into active regions, and electronic components disposed at the active regions and insulated from each other by the device isolation pattern. As semiconductor devices become more highly integrated, the widths of device isolation patterns are becoming smaller. One technique for forming a narrow device isolation pattern is a shallow trench isolation (STI) technique. In this technique, a trench is formed in the substrate, and the trench is filled with insulating material to divide an upper portion of the substrate into active regions. However, a device isolation pattern in a trench formed in a semiconductor substrate may stress the semiconductor substrate (specifically, the active regions). In the case in which the electronic components formed at the active regions are MOS transistors, for example, the stress generated by a device isolation pattern formed in a trench is imparted to the MOS transistors and the operating characteristics of the MOS transistors can be adversely affected by the stress.

Furthermore, the MOS transistors may be concentrated within a predetermined region of the substrate. In this case, the stress imparted to a MOS transistor located in a central part of that region may be different from the stress imparted to a MOS transistor located at the periphery of that region.

SUMMARY

According to one aspect of the inventive concept, there is provided a semiconductor device including a driving region and a dummy region disposed at both sides of the driving region in a first direction, and comprising: a semiconductor substrate having a plurality of active regions in the driving region, and a dummy active region in the dummy region, and a guard ring region surrounding the active regions and the dummy active regions, and in which the active regions are spaced at uniform distances and insulated from each other in the first direction, the distance in the first direction between the dummy active region and an active region nearest to the dummy active region is substantially the same as each of the distances in the first direction between adjacent ones of the active regions, and that distance is smaller than the distance in the first direction between the dummy active region and a portion of the guard ring region nearest to the dummy active region in the first direction.

According to another aspect of the inventive concept, there is provided a semiconductor device comprising: a semiconductor substrate having a plurality of active regions and a dummy active region, a guard ring region surrounding the active regions and the dummy active region, a first device isolation pattern delimiting the active regions, a second device isolation pattern delimiting an outer one of the active regions with the first device isolation pattern, and a third device isolation pattern comprising a segment of insulating material interposed between the dummy active region and the guard ring region in the first direction, and in which the first device isolation pattern comprises segments of insulating material each interposed between adjacent ones of the active regions in a first direction, the second device isolation pattern comprises a segment of insulating material interposed between the dummy active region and the outer one of the active regions in the first direction, the first direction corresponds to the widthwise direction of the segments of insulating material, the width of each of the segments of the first device isolation pattern is substantially the same as that of the segment of the second device isolation pattern, and the width of the segment of the third device isolation pattern is greater than the width of each of the segments of the first device isolation pattern.

According to yet another aspect of the inventive concept, there is provided a semiconductor device comprising: a substrate having trenches extending in an upper portion thereof, a trench isolation layer occupying the trenches, a guard ring region, and electronic components, and in which the trench isolation layer comprises segments of insulating material spaced from each other in a first direction and including a plurality of first segments, a pair of second segments between which the first segments are disposed, and a pair of third segments between which the first and second segments are disposed, each of the segments have a width corresponding to a dimension thereof in the first direction, the trench isolation layer divides the upper portion of the substrate into active regions each of which is delimited in the first direction by adjacent ones of the first and second segments of the trench isolation layer, the electronic components are located at the active regions, respectively, the trench isolation layer also divides the upper portion of the substrate into dummy active regions each of which is delimited in the first direction by adjacent ones of the second and third segments of the trench isolation layer, none of the electronic components of the semiconductor device are located directly at or in the dummy active regions, the guard ring region surrounds the dummy and active regions and borders the third segments of the trench isolation layer in the first direction, and the widths of the first and second segments of the trench isolation layer are substantially the same.

BRIEF DESCRIPTION OF THE DRAWINGS

The inventive concept will become more apparent in view of the attached drawings and accompanying detailed description.

DETAILED DESCRIPTION OF THE PREFERRED EMBODIMENTS

Figure 1:
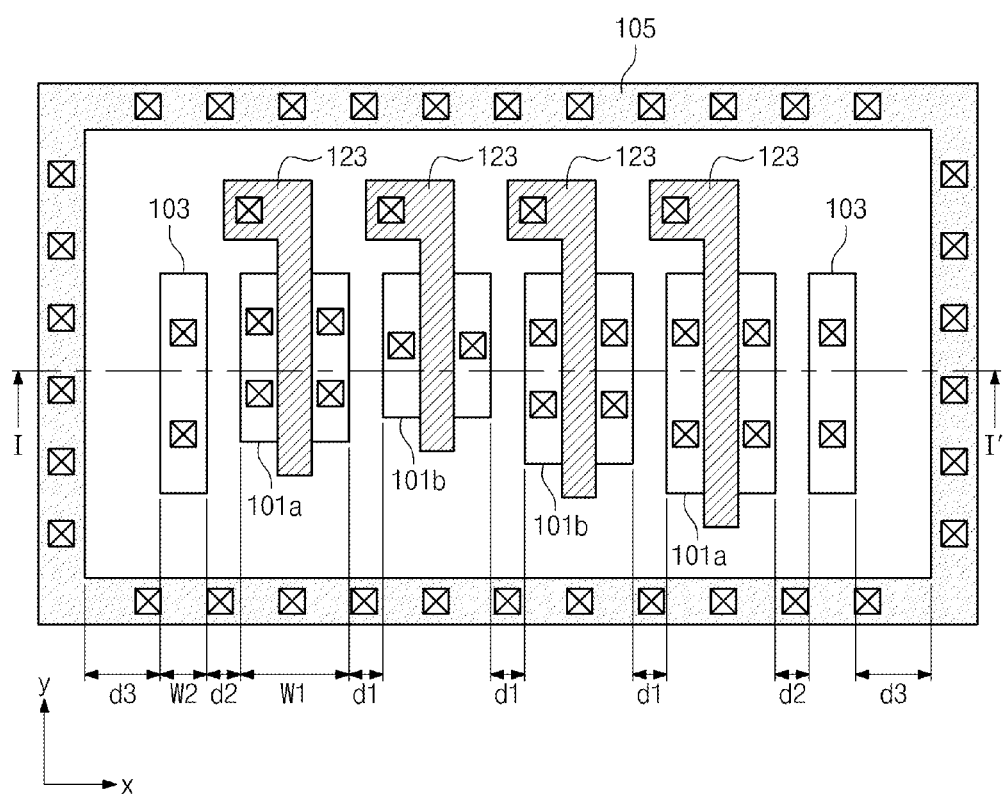
FIG. 1 is a plan view of a portion of one example of a first embodiment of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the plan and cross-sectional views of the semiconductor devices are schematic. Also, like numerals are used to designate like elements throughout the drawings.

Furthermore, spatially relative terms, such as "upper" and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features but does not preclude the presence or additional features. Furthermore, it will be readily apparent that the terms dopant and impurities are used interchangeably to denote an agent that changes the conductivity (type or degree) of the substance in which it has been provided. The term "substrate" may refer to the unadulterated body of material that remains after various regions of the original body of material have been doped. The term "distance" generally refers to the shortest straight line distance between features in a given reference plane such as the plane of the upper surface of the substrate, as is clear from the drawings.

It will also be understood that although the terms first, second, third, etc., are used herein to describe various elements, regions, etc., these elements and/or regions are not limited by these terms. These terms are only used to distinguish one element or region from another.

Semiconductor devices according to the inventive concept will now be described in more detail. However, before such a description proceeds, it is to be noted that the inventive concept may be applied to many different types of semiconductor devices including a Dynamic Random Access Memory (DRAM), a Static Random Access Memory (SRAM), a Programmable ROM (PROM), a Erasable PROM (EPROM), a Electrically EPROM (EEPROM), a Flash Memory, a Phase change Random Access Memory (PRAM), a Resistive RAM (RRAM), a Magnetic RAM (MRAM) and a Ferroelectric RAM (FRAM). Furthermore, a semiconductor device according to the inventive concept may be employed by various electronic devices/systems such as a Micro Electro Mechanical System (MEMS) device, an optoelectronic device, and a processor such as a Central Processing Unit (CPU) or a Digital Signal Processor (DSP). Furthermore, the inventive concept may be realized in the form of a semiconductor package including several of the same kinds of semiconductor devices. Alternatively, the inventive concept may be realized in the form of a single chip data processing device (such as a System On Chip (SOC)) which has different kinds of semiconductor devices.

A first embodiment of a semiconductor device according to the inventive concept will now be described with reference to FIGS. 1-3.

Figure 2:
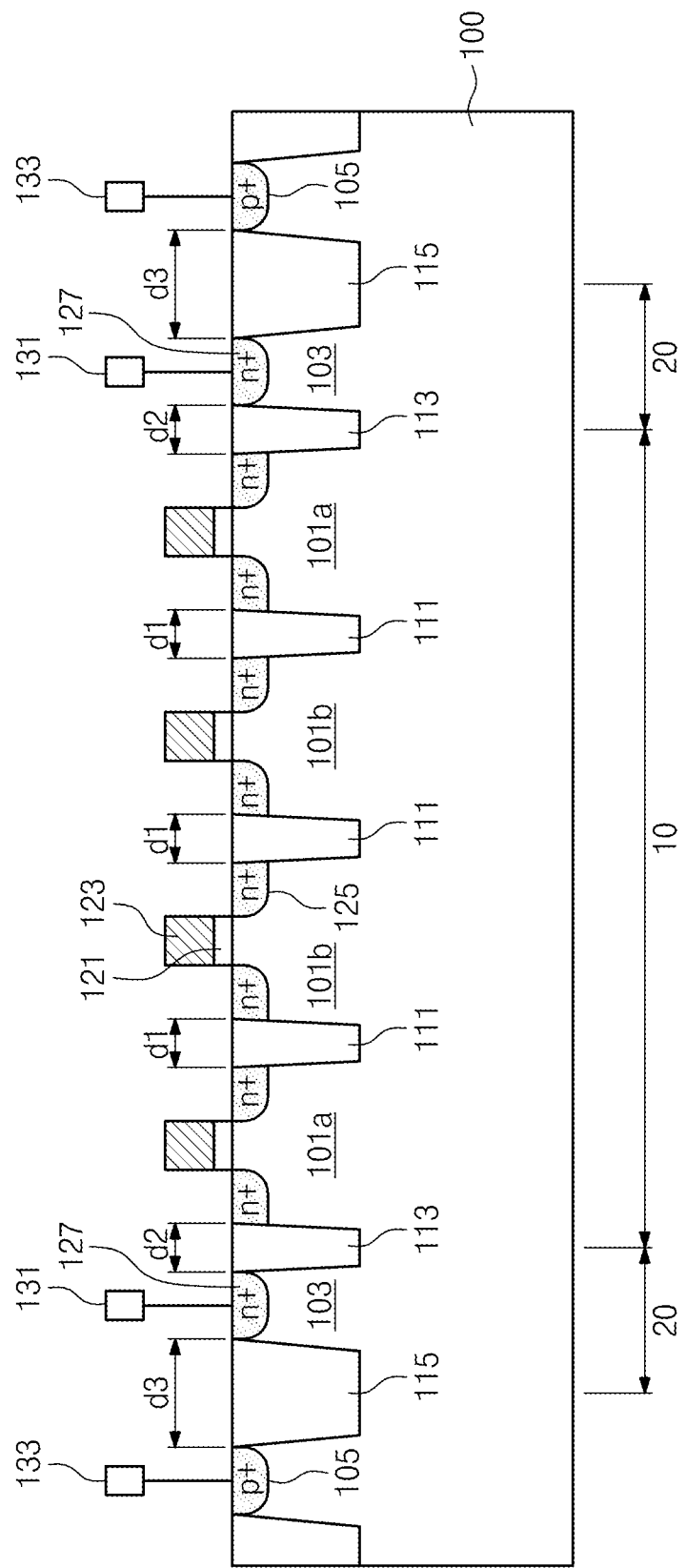
FIG. 2 is a cross-sectional view of the device taken along line I-I' of FIG. 1.
Figure 3:
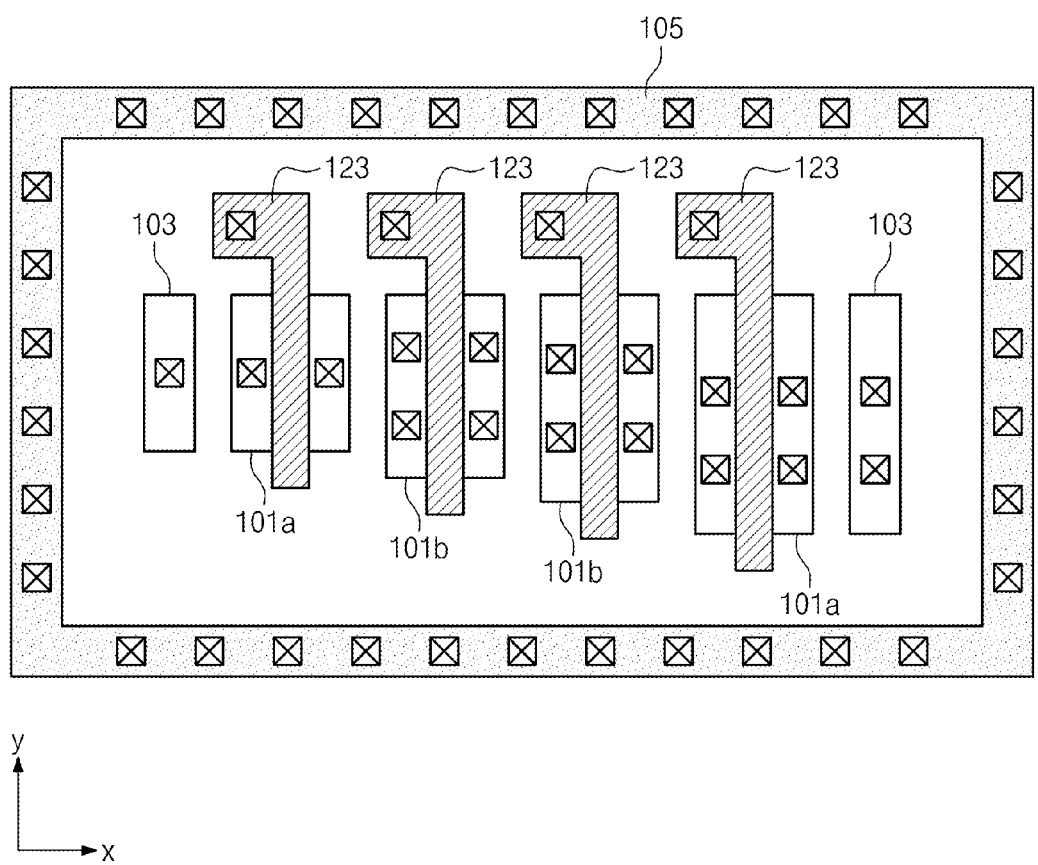
FIG. 3 is a plan view of a portion of another example of the first embodiment of a semiconductor device according to the inventive concept.

In a first example, as shown in FIGS. 1 and 2, a semiconductor device according to the inventive concept has a driving region 10 and dummy regions 20 at both sides of the driving region 10. The device comprises a substrate 100 having a guard ring region 105 formed in the semiconductor substrate 100 and surrounding the driving region 10 and the dummy regions 20. That is, the guard ring region 105 may have the shape of a loop surrounding the driving and dummy regions 10 and 20 when viewed in plan. The guard ring region 105 may be a doped region which is formed by implanting impurities of a first conductivity type (e.g., p type impurities) into the semiconductor substrate 100 or a well (not shown).

Furthermore, the semiconductor device includes fine electronic components at the driving region 10 of the semiconductor substrate 100. For example, a MOS transistor, a power capacitor and/or a resistor may be disposed at the driving region 10. In one example of this embodiment, MOS transistors are formed at the driving region 10. The predetermined operating characteristics (e.g., threshold voltage) of the MOS transistors may be substantially the same or different from each other.

More specifically, in the illustrated example in which electronic components at the upper portion of the driving region 10 of the substrate 100 are MOS transistors, a first device isolation pattern 111 divides the driving region 10 into a plurality of active regions including outer active regions 101a closest to the guard ring region 105 and inner active regions 101b. The active regions 101a and 101b are regions doped with impurities of the first conductivity type. The active regions 101a and 101b are separated (insulated by the device isolation pattern 111) from each other in a first direction (the x-axis direction in FIG. 1) by distances d1. The distances d1 may be equal, i.e., the active regions 101a and 101b may be spaced from each other uniformly in the first direction. On the other hand, the distance between each outer active region 101a and the portion of the guard ring region 105 adjacent thereto may be greater than the distance d1 between adjacent ones of the active regions 101a and 101b.

Also, in the illustrated example of the present embodiment, the active regions 101a and 101b have the same widths W1 (dimensions in the first direction). On the other hand, the lengths of the active regions 101a and 101b (dimensions in a second direction perpendicular to the first direction which is the y-axis direction in the figures) are different from each other. However, the active regions 101a and 101b may have the same lengths.

The MOS transistors include gate electrodes 123 crossing over the active regions 101a and 101b, respectively. A gate insulating layer 121 is interposed between each of the gate electrodes 123 and the semiconductor substrate 100. Like the active regions 101a and 101b, the lengths of the gate electrodes 123 (dimensions in the second direction) may be different from each other. Dopant regions 125 serving as source/drain electrodes of the MOS transistors are located in each of the active regions 101a and 101b at both sides of each of the gate electrodes 123. The dopant regions 125 contain impurities of a second conductivity type (e.g., n type impurities) different from that of the guard ring region 105.

A dummy active region 103 is located in the dummy region 20. The dummy active region 103 is a region doped with impurities of the first conductivity type, i.e., is of the same conductivity type as the guard ring region 105. In the present embodiment, a dummy dopant region 127 is provided in the dummy active region 103. The dummy dopant region 127 is a region doped with impurities of the second conductivity type, i.e., is of a conductivity type different from that of the guard ring 105. A second device isolation pattern 113 spaces the dummy active region 103 from the adjacent active region, namely, outer active region 101a. A third device isolation pattern 115 spaces the dummy active region 103 from the guard ring region 105. The distance d2 between the dummy active region 103 and the outer active region 101a may be substantially the same as the distance d1 between adjacent ones of the active regions 101a and 101b. On the other hand, the distance d2 between the dummy active region 103 and the outer active region 101a may be smaller than the distance d3 between the dummy active region 103 and the guard ring region 105. That is, the width d2 of the second device isolation pattern 113 may be smaller than the width d3 of the third device isolation pattern 115.

Furthermore, the width W2 of the dummy active region 103 (dimension in the first direction) may be smaller than the width W1 of each of the active regions 101a and 101b. Also, in this respect, the width W2 of the dummy active region 103 is preferably the minimum line width realized according to the design rule of a semiconductor device. For example, the width W2 of the dummy active region 103 may be the minimum line width that can be produced by the photolithography equipment used for manufacturing the semiconductor device.

As concerns the length of the dummy active region 103 (dimension in the second direction), in the example illustrated in FIG. 1, the length of the dummy active region 103 is substantially the same as that of the longest one of the active regions 101a and 101b, i.e., is substantially the same as that maximum length of active regions 101a and 101b. Alternatively, in the example illustrated in FIG. 3, the length of the dummy active region 103 is substantially the same as the length of the outer active region 101a.

In the embodiment described above, the widths d1 and d2 of the first and second device isolation patterns 111 and 113 located at both sides of the outer active region 101a, respectively, may be substantially identical due to the provision of the dummy active region 103. As a result, the stress imparted to the outer active region 101a by the first and second device isolation patterns 111 and 113 may be substantially the same as the stress imparted to the active region 101b by the first device isolation patterns 111. That is, physical stress created by the first and second device isolation patterns 111 and 113 may be uniformly applied to the active regions 101a and 101b. Thus, certain characteristics of the MOS transistors are prevented from being degraded.

In addition, in the illustrated embodiment, the active regions 101a and 101b and the dummy active region 103 surrounded by the guard ring region 105 are spaced from each other in the first direction (e.g. x-axis direction). The distance between the guard ring region 105 and each respective active region 101a and 101b in the second direction (e.g. y-axis direction, or longitudinal direction of the active region 101a or 101b) may be equal to or smaller than the length of that active region 101a or 101b.

Furthermore, in this embodiment in which the semiconductor substrate 100 and guard ring region 105 are each of a first conductivity type (e.g., p type), and the dummy dopant region 127 in the dummy active region 103 is of the second conductivity type (e.g., n type), the dummy active region 103 is electrically connected to a first pad 131 which is supplied with a power voltage VDD, whereas the guard ring region 105 is electrically connected to a second pad 133 which is supplied with a ground voltage Vss. Therefore, a reverse bias may be supplied to a diode consisting of the dummy dopant region 127, the guard ring region 105 and the semiconductor substrate 100. Thus, a relatively thick depletion layer is formed by a junction between the dummy dopant region 127 of the second conductivity type and the semiconductor substrate 100 of the first conductivity type. As a result, electrical interference between the MOS transistors due to the dummy dopant region 127 may be reduced or prevented.

Figure 4:
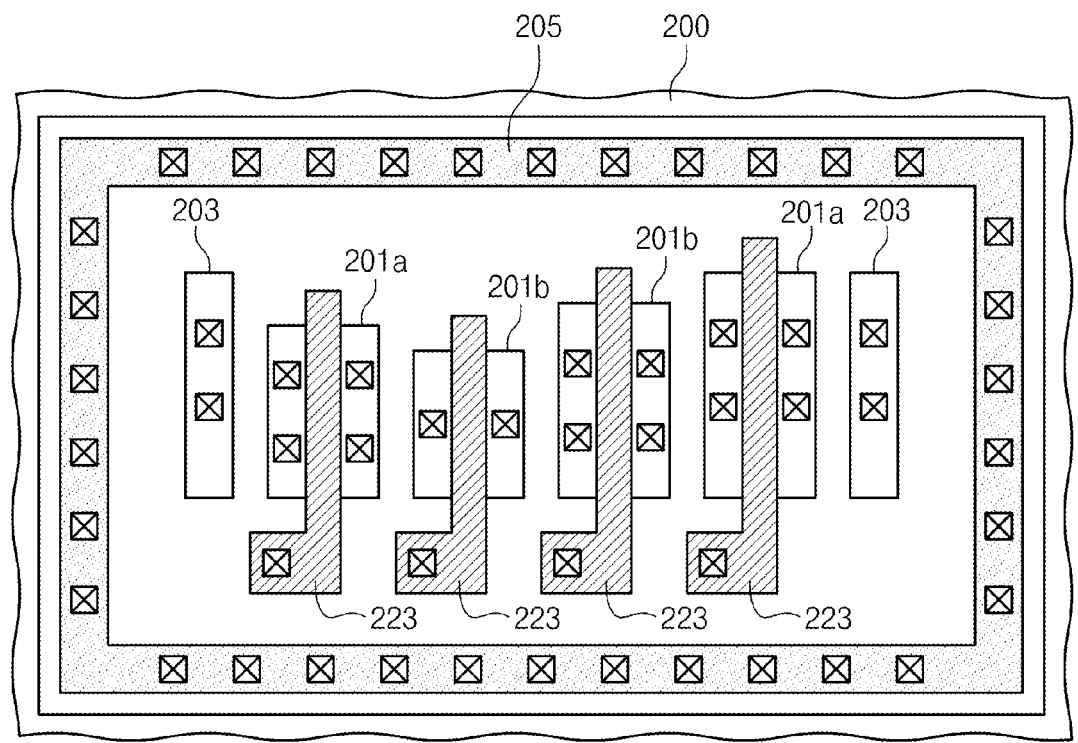
FIG. 4 is a plan view of a portion of another embodiment of a semiconductor device according to the inventive concept.
Figure 4:
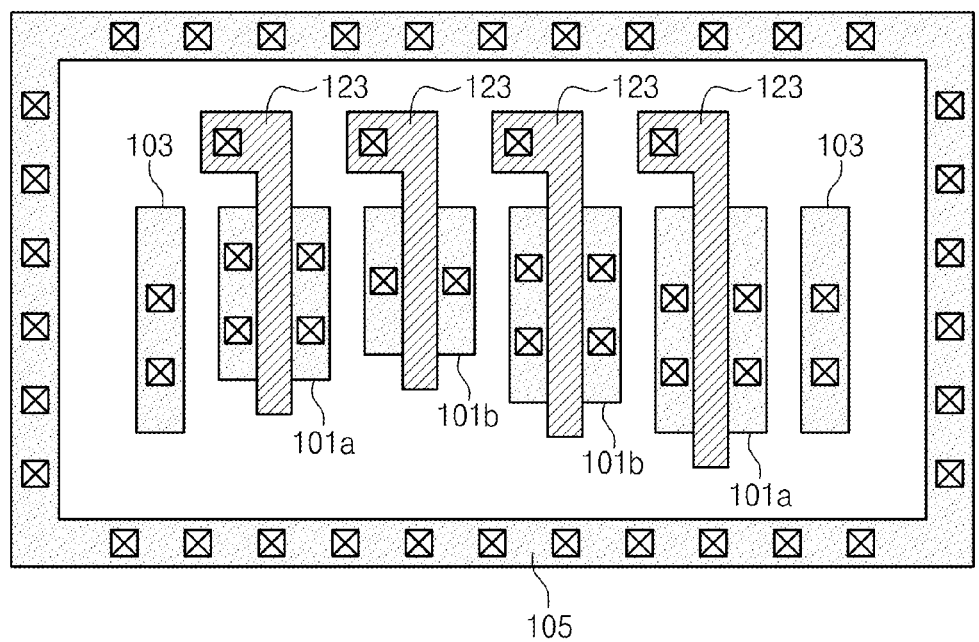

Another embodiment of a semiconductor device according to the inventive concept will now be described in detail with reference to FIG. 4.

This embodiment of a semiconductor device includes a semiconductor substrate 100 having a first guard ring region 105, a second guard ring region 205, and respective driving region and dummy regions surrounded by each of the first and second guard ring regions 105 and 205 in plan. The first and second guard ring regions 105 and 205 may be regions formed by implanting impurities into the semiconductor substrate 100 or into a well in the substrate.

In an example of this embodiment, the first and second guard ring regions 105 and 205 have conductivity types different from each other. For example, the first guard ring region 105 is a region doped with n type dopants, and the second guard ring region 205 is a region doped with p type dopants. Also, one of the first and second guard ring regions 105 and 205 (guard ring region 205 in the illustrated example) is formed in a well 200 in the semiconductor substrate 100.

Furthermore, in the illustrated embodiment, PMOS transistors are surrounded by the first guard ring region 105 as viewed in plan. The PMOS transistors are spaced form each other in a first direction (e.g., the x-axis direction in FIG. 4). On the other hand, NMOS are surrounded by the second guard ring region 205 as viewed in plan.

More specifically, first active regions 101a and 101b of the substrate 100 are defined in a first inner region surrounded by the first guard ring region 105. A first dummy active region 103 is interposed between the first guard ring region 105 and the first active region 101a nearest to the first guard ring region 105. A first dummy dopant region containing impurities of a conductivity type (p type) different from that of the first guard ring region 105 is formed in the first dummy active region 103. Also, first gate electrodes 123 cross over the first active regions 101a and 101b, respectively. Dopant regions containing p type impurities, i.e., impurities of a conductivity type different from that of the first guard ring region 105, are formed in the first active regions 101a and 101b at opposite sides of each first gate electrode 123. The doped regions serve as source/drain electrodes for the MOS transistors.

Similarly to the embodiment described with reference to FIGS. 1 to 3, the first active regions 101a and 101b are spaced from each other in the first direction at uniform intervals by first device isolation pattern 111. Also, the distance between the first guard ring region 105 and the first active region 101a nearest to the first guard ring region 105 may be greater than the distance between adjacent ones of the active regions 101a and 101b. The distance between the first dummy active region 103 and the first active region 101a nearest to the first dummy active region 103 may be substantially the same as the distance between adjacent ones of the active regions 101a and 101b. The distance between the first dummy active region 103 and the first guard ring region 105 nearest to the first dummy active region 103 may be greater than the distance between the first dummy active region 103 and the first active region 101a nearest to the first dummy active region 103.

Moreover, and again, similarly to the embodiment described with reference to the first embodiment, the width of the first dummy active region 103 may be substantially equal to or smaller than the width of each of the first active regions 101a and 101b. As described with reference to FIG. 2, the length of the first dummy active region 103 may be substantially the same as the greatest one of the lengths of the first active region 101a and 101b. Alternatively, as described with reference to FIG. 3, the length of the first dummy active region 103 may be substantially the same as the length of the active region 101a nearest to the first dummy active region 103.

Second active regions 201a and 202b and second dummy active regions 203 are defined in a second inner region of the substrate and are surrounded by the second guard ring region 205 as viewed in plan. A second dummy dopant region containing n type impurities, i.e., impurities of a conductivity type different from that of the second guard ring region 205, is formed in the second active region 203. Second gate electrodes 223 cross over the second active regions 201a and 202b, respectively. Dopant regions containing n type impurities, i.e., impurities of a conductivity type different form that of the second guard ring region 205, are formed in the active regions 201a and 202b at opposite sides of each second gate electrodes 223. The other characteristics of and structural relationship between the second guard ring region 205, the second active regions 201a and 201b and the second dummy active region 203 are substantially the same as those described with respect to the first guard ring region 105, the first active region 101a and 101b and the first dummy active region 103.

On the other hand, in the present embodiment, the first guard ring region 205, the second active regions 201a and 201b and the second dummy active region 203 are disposed in an n-well 200 (well of the first conductivity type in this example) formed in the p-type of semiconductor substrate 100 (second conductivity type in this example). A relatively great distance can be secured between the well 200 and the second active region 201a nearest to the second guard ring region 205 because the second dummy active region 203 is interposed between the second guard ring region 203 and the second active region 201a nearest to the second guard ring region 203. Thus, this ensures that the MOS transistors retain their desired design characteristics.

In the embodiments of a semiconductor device according to the inventive concept as described above, the dummy active region is interposed between the guard ring region and the active regions. Therefore, physical stress created by device isolation pattern may be uniformly distributed across a plurality of the active regions. As a result, electronic components such as MOS transistors provided at the active regions, respectively, can retain their desired and/or uniform characteristics.

In addition, the distance between the guard ring region and the active region nearest to the guard ring region can be wide enough to minimize a well proximity effect in which characteristics of MOS transistors vary with differences in the distance between the MOS transistors and the boundary of the well.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device including a driving region and a dummy region disposed at both sides of the driving region in a first direction, and comprising:
    a semiconductor substrate having a plurality of active regions in the driving region, and a dummy active region in the dummy region, the active regions being spaced at uniform distances and insulated from each other in the first direction; and
    a guard ring region surrounding the active regions and the dummy active regions,
    wherein the distance in the first direction between the dummy active region and an active region nearest to the dummy active region is substantially the same as each of the distances in the first direction between adjacent ones of the active regions, and is smaller than the distance in the first direction between the dummy active region and a portion of the guard ring region nearest to the dummy active region in the first direction.

2. The semiconductor device of claim 1, wherein a width of the dummy active region, corresponding to a dimension of the dummy active region in the first direction, is smaller than each of those of the active regions.

3. The semiconductor device of claim 1, wherein the lengths of the active regions, corresponding to the dimensions of the active regions in a second direction perpendicular to the first direction, are different from each other, and
    the length of the dummy active region, corresponding to a dimension of the dummy active region in the second direction, is substantially the same as that of the active region nearest to the dummy active region in the first direction.

4. The semiconductor device of claim 1, wherein the lengths of the active regions, corresponding to the dimensions of the active regions in a second direction perpendicular to the first direction, are different from each other, and
    the length of the dummy active region, corresponding to a dimension of the dummy active region in the second direction, is substantially the same as the greatest one of the lengths of the active regions.

5. The semiconductor device of claim 1, wherein the width of the dummy active region, corresponding to a dimension of the dummy active region in the first direction, is smaller than each of those of the active regions, and
    the length of the dummy active region, corresponding to a dimension of the dummy active region in a second direction perpendicular to the first direction, is substantially the same as that of the active region nearest to the dummy active region.

6. The semiconductor device of claim 1, wherein the total length of the space between the guard ring region and each of the active regions in a second direction perpendicular to the first direction is equal to or smaller than the length of the active region corresponding to the dimension of the active region in the second direction.

7. The semiconductor device of claim 1, further comprising a dummy dopant region at an upper portion of the dummy active region and comprising dopant of a first conductivity type, and
    wherein the guard ring region is a region containing dopant of a second conductivity type opposite that of the first conductivity type.

8. The semiconductor device of claim 7, wherein the first conductivity type is an n type and the second conductivity type is a p type, and
    further a power voltage pad, to which a power voltage is to be applied, and electrically connected to the dummy dopant region, and
    a ground voltage pad, to which a ground voltage is to be applied, and electrically connected to the guard ring region.

9. The semiconductor device of claim 1, further comprising:
- gate electrodes crossing over the active regions, respectively; and
- source/drain electrodes at upper portions of each of the active regions at both sides of each of the gate electrodes.

10. A semiconductor device comprising:
- a semiconductor substrate having a plurality of active regions, and a dummy active region;
- a guard ring region surrounding the active regions and the dummy active region;
- a first device isolation pattern delimiting the active regions, the first device isolation pattern comprises segments of insulating material each interposed between adjacent ones of the active regions in a first direction;
- a second device isolation pattern delimiting an outer one of the active regions with the first device isolation pattern, the second device isolation pattern comprising a segment of insulating material interposed between the dummy active region and the outer one of the active regions in the first direction; and
- a third device isolation pattern comprising a segment of insulating material interposed between the dummy active region and the guard ring region in the first direction, and
- wherein the width of each of the segments of the first device isolation pattern, corresponding to a dimension thereof in the first direction, is substantially the same as that of the segment of the second device isolation pattern, and
- the width of the segment of the third device isolation pattern, corresponding to a dimension thereof in the first direction, is greater than the width of each of the segments of the first device isolation pattern.

11. The semiconductor device of claim 10, wherein the width of the dummy active region, corresponding to a dimension thereof in the first direction, is smaller than each of those of the active regions.

12. The semiconductor device of claim 10, wherein the lengths of the active regions, corresponding to the dimensions thereof in a second direction perpendicular to the first direction, are different from each other, and
- the length of the dummy active region corresponding to a dimension thereof in the second direction, is substantially the same as that of the outer one of the active regions.

13. The semiconductor device of claim 10, further comprising a dummy dopant region at an upper portion of the dummy active region and containing dopant of a first conductivity type, and
- wherein the guard ring region is a region containing dopant of a second conductivity type opposite to that of the first conductivity type.

14. The semiconductor device of claim 10, further comprising:
- gate electrodes crossing over the active regions, respectively; and
- source/drain electrodes at upper portion of each of the active regions at both side of each of the gate electrodes.

15. A semiconductor device comprising a substrate having trenches extending in an upper portion thereof, a trench isolation layer occupying the trenches, a guard ring region, and electronic components,
- wherein the trench isolation layer comprises segments of insulating material spaced from each other in a first direction, the segments including a plurality of first segments, a pair of second segments between which the first segments are disposed, and a pair of third segments between which the first and second segments are disposed, and each of the segments having a width corresponding to a dimension thereof in the first direction,
- the trench isolation layer divides the upper portion of the substrate into active regions each of which is delimited in the first direction by adjacent ones of the first and second segments of the trench isolation layer, and at which the electronic components are located, respectively,
- the trench isolation layer divides the upper portion of the substrate into dummy active regions each of which is delimited in the first direction by adjacent ones of the second and third segments of the trench isolation layer, and at which none of the electronic components of the semiconductor device are located,
- the guard ring region surrounds the dummy and active regions, and borders the third segments of the trench isolation layer in the first direction, and
- the widths of the first and second segments of the trench isolation layer are substantially the same.

16. The semiconductor device of claim 15, wherein the widths of the third segments of the device isolation layer are each greater than each of the widths of the first and second segments of the device isolation layer.

17. The semiconductor device of claim 15, wherein each of the active regions containing the electronic components and each of the dummy active regions has a width corresponding to a dimension thereof in the first direction, and the width of each of the active regions containing the electronic components is greater than the width of each of the dummy active regions.

18. The semiconductor device of claim 15, wherein each of the electronic components is a transistor.

19. The semiconductor device of claim 18, wherein the transistor has source and drain regions of a first conductivity type at opposite sides of the active region, and a gate electrode, and
- the guard ring region is a doped region of a second conductivity type opposite to the first conductivity type, and
- further comprising a dummy dopant region of the first conductivity type spanning the second and third segments of the trench isolation layer.

20. The semiconductor device of claim 19, further comprising a well of the second conductivity type in the substrate, and wherein the guard ring region, the active regions at which the transistors are located, and the dummy active regions are disposed in the well.

* * * * *